(12) United States Patent
Gelsomini et al.

(10) Patent No.: US 6,368,901 B2
(45) Date of Patent: Apr. 9, 2002

(54) INTEGRATED CIRCUIT WIRELESS TAGGING

(75) Inventors: Tito Gelsomini, Plano, TX (US); Giulio G. Marotta, Contigliano (IT); Sebastiano D'Arrigo, Cannes (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/800,519

(22) Filed: Mar. 8, 2001

Related U.S. Application Data

(62) Division of application No. 09/354,262, filed on Jul. 15, 1999, now abandoned.

(51) Int. Cl.[7] .............................................. H01L 21/82
(52) U.S. Cl. ...................................... 438/131; 438/907
(58) Field of Search ................................. 438/106, 131, 438/205, 207, 218, 294, 427, 907, 925

(56) References Cited

U.S. PATENT DOCUMENTS 5,612,532 A   3/1997  Iwasaki ..................... 235/492
5,852,289 A  12/1998  Masahiko .................. 235/492
6,078,845 A * 6/2000  Friedman ................... 700/104

* cited by examiner

Primary Examiner—David Nelms
Assistant Examiner—Phuc T. Dang
(74) Attorney, Agent, or Firm—Wade James Brady III; Frederick J. Telecky Jr.

(57) ABSTRACT

A semiconductor device comprising an integrated circuit and an information unit, said unit being electrically separate from said integrated circuit; an integrated antenna electrically connected with said unit; and an electronic data bank integral with said unit. A method of fabricating an information unit into an integrated circuit chip comprising forming an integrated circuit into a semiconductor substrate using a plurality of process steps; concurrently forming an information unit using a selection of said process steps so that said unit becomes integrated into said chip but remains electrically separate from said integrated circuit; concurrently forming an antenna using a selection of said process steps so that said antenna becomes integrated into said chip and electrically connected to said information unit; providing a data bank within said information unit; and encoding electronic data permanently into said data bank.

14 Claims, 3 Drawing Sheets

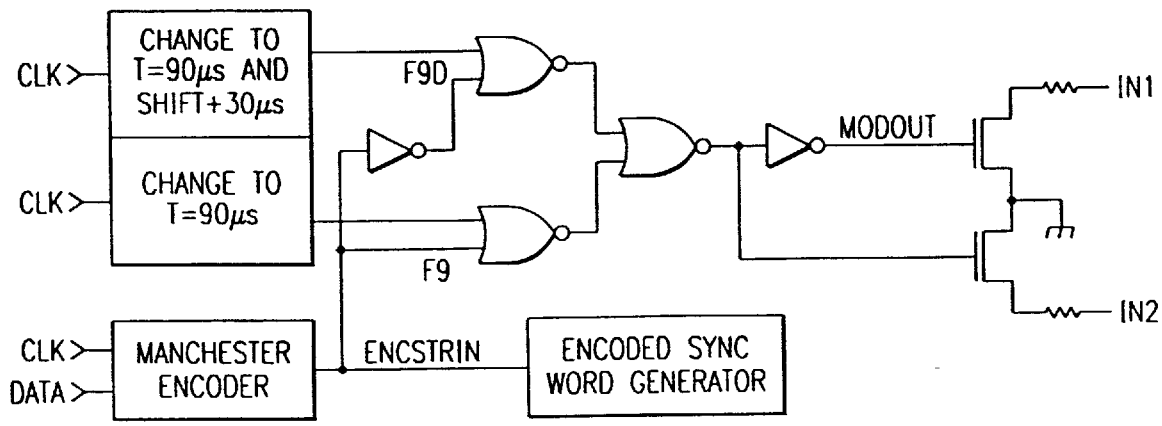
FIG. 5
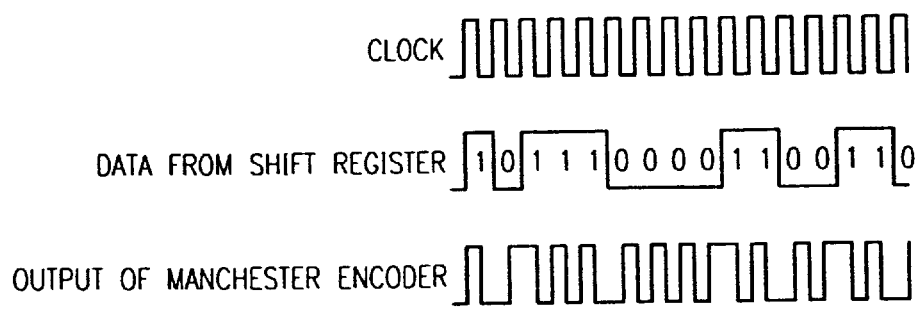
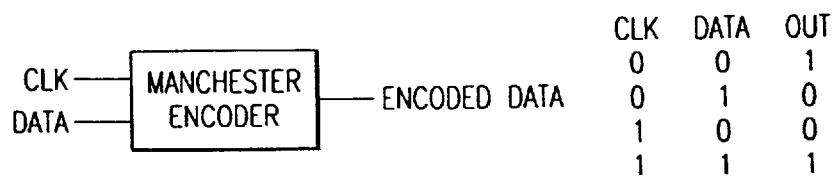
FIG. 6

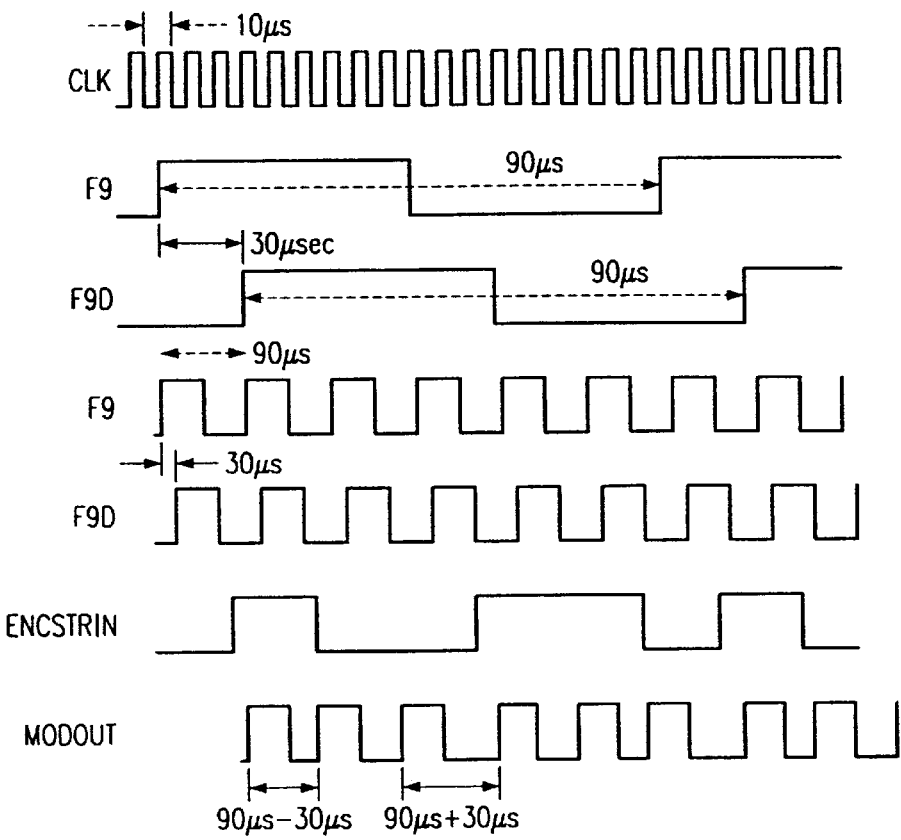
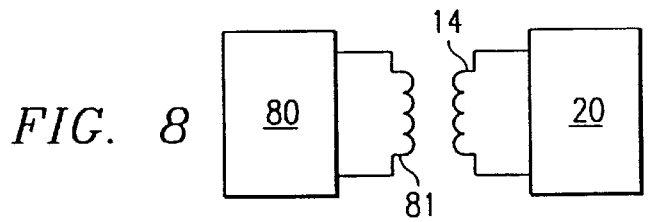
FIG. 8
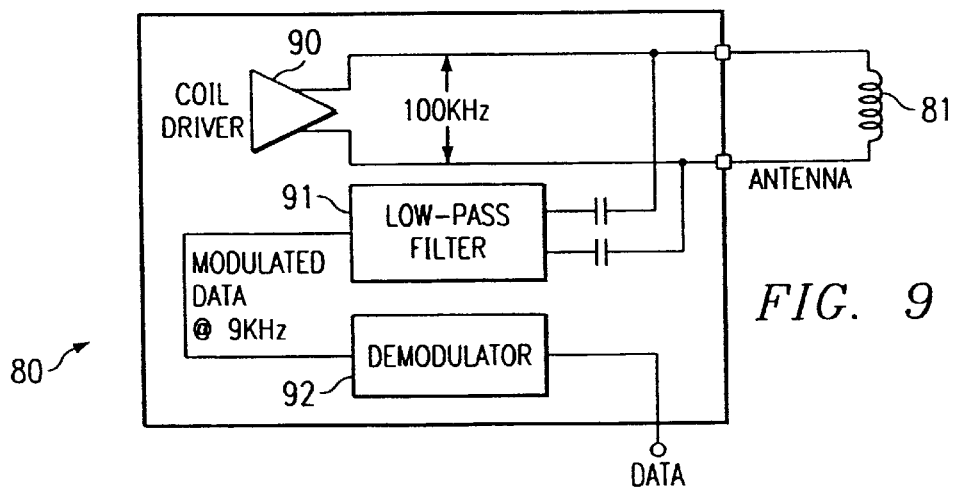
FIG. 9

INTEGRATED CIRCUIT WIRELESS TAGGING

CROSS REFERENCE TO PRIOR APPLICATIONS

This application is a division of Ser. No. 09/354,262, filed Jul. 15, 1999 now abandoned.

FIELD OF THE INVENTION

The present invention is related in general to the field of semiconductor devices and methods, and more specifically to integrated circuits and methods of fabrication and operation comprising an information unit with permanent coding for wireless tagging.

BACKGROUND OF THE INVENTION

Semiconductor chips have suffered, on a global scale, a steep increase of illegal use or outright theft in the last few years. Thefts are now occurring more at distribution and shipping centers rather than at factories. Worldwide losses of electronic components thefts are estimated at $8 billion per year, with the average theft typically resulting in a $750,000 loss (Dallas Morning News, Jan. 5, 1998, after Electronic News). According to Central News Agency, Taiwan, Feb. 26, 1998, a semiconductor company in Taoyuan County, Taiwan, was robbed of more than 3 million computer memory chips, worth more than $20 Million.

It would be a tremendous crime deterrent if each semiconductor chip could be permanently marked for recording producer, date of production, country of origin, and possibly fabrication history and performance characteristics. Unfortunately, known technology does not offer this capability. What is available, are discrete semiconductor devices for attachment onto larger objects for registration and identification purposes. For instance, semiconductor devices are produced which make it possible to identify or detect their presence in objects which are provided with such devices; the detection can be accomplished in contactless manner and over certain distances. As an example, U.S. Pat. No. 5,053,774 of Oct. 1, 1991 (Schuermann et al., "Transponder Arrangement") describes a transponder arrangement comprising an interrogation unit which transmits at least one RF interrogation pulse to a responder unit which thereupon sends data stored therein back to the interrogation unit in the form of a modulated RF carrier.

The basic transponder concept has been refined and modified for specific applications. For instance, in the paper "A Low Power Transponder IC for High Performance Identification Systems" (U. Kaiser and W. Steinhagen, 1994 Custom Integrated Circuits Conf., Proc. CICC '94, pp. 14.4.1–14.4.4), an integrated circuit for a battery-less transponder system is presented. Battery-less transponders require contactless transmission of both the information and power between a mobile data carrier and a stationary or hand-held reader unit, allowing significant reading distance (about 2 m) due to separation of the powering and data transmission phases. First, energy is transmitted to and stored in a supply capacitor of the transponder. Second, the data information is then sent back to the reader unit using the energy stored in the capacitor.

Devices with these characteristics are for instance fabricated by Texas Instruments Incorporated under the tradename TIRIS™. Applications for these transponders include identifications over a certain distance, or detection whether the object is at a predetermined location or not. In other examples, physical parameters such as the temperature or the pressure are to be interrogated directly at or in the object without direct access to the object being possible. The devices are robust and reliable under difficult environmental conditions (dust, humidity, heat, cold, etc.). The devices can for instance be attached to an animal which can then be identified at an interrogation point without direct contact, or to a person which can then obtain access to restricted areas. Other examples include computer-controlled industrial production for identifying objects marked by the transponder.

None of these capabilities include permanent storing or wireless retrieving of the chip's individual identification, characteristics and performance. An approach to utilize the fuses of redundant rows and columns in dynamic random-access memories (DRAMs) for coding data, offers only very limited amounts of data, which further have to be retrieved through the device pins in complicated ways and cannot be retrieved at all when the device is active. When the device is mounted on a board, the stored information is no longer accessible.

In addition to the theft watch mentioned above, permanent individual chip identification is desired by recent requirements in qualification (e.g., ISO 9000). Furthermore, individual chip information regarding location within a semiconductor wafer, fabrication history, batch identification, and parametric and functional test results would greatly support recent efforts to achieve so-called "built-in reliability". This refers to chip reliability assured by painstaking adherence during chip fabrication to recognized design rules and process controls—an approach much faster and cheaper than the traditional so-called "tested-in reliability" which is guaranteed only after prolonged and accelerated testing. Unfortunately, none of this information is available today for individual chips, or it can be obtained only after expensive efforts, such as the (destructive) removal of chip packages in order to access chips for time-consuming analysis.

An urgent need has therefore arisen for a low-cost and uncomplicated method to permanently tag each individual semiconductor chip, and an easily applicable, always available technique to read the stored information, while not interfering with device operation. Any solid-state structure required by the method should use configurations which are fully integrated in the circuit level of the chip but consume only minimal silicon real estate, and which can be fabricated without additional cost using the same mass-production processes as the actual circuit. The system and method should be applicable to a wide spectrum of design, material and process variations, leading to improved process yield and device reliability. Preferably, these innovations should be accomplished using the installed process and equipment base so that no investment in new manufacturing machines is needed.

SUMMARY OF THE INVENTION

The present invention is related to semiconductor integrated circuits (ICs) of any kind, especially those having high density and high value. These ICs can be found in many semiconductor device families such as processors, digital and analog devices, to memory and logic devices, high frequency and high power devices, specifically in large area chip categories. The invention offers an inexpensive way to permanently store into, and wireless retrieve from an integrated circuit chip a coded individual identification as well as manufacturing and engineering data. Examples include wafer fab lot number, chip location on the wafer, test results, bin number and so on.

Some of the major features of the invention to both the manufacturer and the user comprise:

Data storage and retrieval: Individual wafer level engineering data can be stored in the chip and then retrieved at any time, even after the chip has been encapsulated or packaged and assembled on a board. Consequently, parametric and functional performance data measured at the wafer level can be compared to final test data after assembly. This task has been recognized as a necessity in manufacturing science for cost-conscious process development, yet was unobtainable before the invention.

The comparison of design expectations and process results enables a stabilization of the process at its optimum and in a shorter time, thus shortening the number of design revisions customarily required to optimize a device design.

Anti-theft coding: Tagging the IC by the teachings of the invention, allows wireless identification of origin and source of the IC, even when it is already assembled into a finished product. The invention thus represents an effective aid for law enforcement.

Easy warehouse handling: With every single IC uniquely identified according to the invention, handling and shipping operations become easily automated and error-free, thus contributing to reduced costs and human errors.

Better customer service: Correlating with the wafer level engineering and manufacturing data encoded according to the invention, field failures of semiconductor devices can be more understood and eventually prevented. The invention offers the urgently needed advancement of improving product quality and reliability by process control, thus building-in reliability rather than testing it in.

As the invention teaches, these features will be realized without interfering with the layout and design of the IC, or its operating performance, or its specifications.

In accordance with the present invention, a small amount of IC real estate (less than 0.1% of an average IC area, or less than 1 bond pad area) is used to add a small IC as an information unit. This information unit is fabricated into the same surface of the semiconductor chip as the main IC, but represents an electrically separate entity. The information unit is fabricated concurrently with the main IC, and consequently requires no extra processing steps or cost for manufacturing. It contains an electronic data bank, made of a plurality of electrical fuses which can be irreversibly opened by laser pulses.

The information unit is powered wirelessly and continuously by radio-frequency signals, sent by an interrogation device and received by an antenna. This antenna is also integrated into the semiconductor chip and electrically connected to the information unit. This antenna is also fabricated concurrently with the main IC, requiring no extra processing steps or cost. The same antenna serves to broadcast the data stored in the data bank after the data have been used to modulate the received signals. The broadcast data are received by the interrogation device and forwarded to further analysis.

No extra component parts, such as an energy-storing capacitor or a separate antenna, are needed.

It is an object of the invention to tag semiconductor IC chips with individual information about identification, production history and performance, and to provide means to the chip to retrieve this information wirelessly. This object is achieved through integrating an information unit and an electrically connected antenna to the IC surface of the chip and keeping both electrically separate from the IC.

Another object of the present invention is to design the information unit so that the information can be encoded in a data bank while the chip is still in wafer form, as well as after its singulation. This object is achieved by providing a plurality of electrical fuses in the data bank which can be irreversibly opened by applying focused laser pulses.

Another object of the present invention is to provide fabrication processes for the information unit and the antenna which are concurrent to the IC fabrication processes, and also operate at high speed, so that they do not add extra cost to the manufacturing.

Another object of the present invention is to design the information unit and antenna such that their fabrication is flexible and can be adopted to the most commonly used and accepted IC fabrication processes.

Another object of the present invention is to provide the information unit with means to receive constant electromagnetic signals from an interrogation device through the antenna. Furthermore, the information unit comprises means to modulate the received signals by encoding wave forms from the electronic data stored in the data bank. After modulation, the antenna is enabled to respond the encoded information back to the cooperating interrogation device.

Another object of the present invention is to format the retrieved modulated signals such that they can be electronically processed, for instance by a tester or a data analyzer.

These objects have been achieved by the teachings of the invention concerning design concepts and process flows suitable for mass production. Various modifications have been successfully employed to satisfy different selections of product geometries and materials.

In one embodiment of the invention, the information unit is located in one corner of the semiconductor chip, integrated into the circuit surface, and the antenna is a closed metallized line, also integrated into the circuit surface of the chip, surrounding the IC.

In another embodiment of the invention, the antenna is part of the sacrificial metal structures positioned in proximity to the dicing lines surrounding the IC for arresting nascent microcracks.

In another embodiment of the invention, the parts of the information unit—the rectifier bridge circuit, the electronic clock extract circuit, the electronic encoder/modulator circuit, and the data bank—are spatially distributed in available niches of the IC, thus minimizing any real estate area consumed.

In yet another aspect of the invention, a method of fabricating the information unit includes the steps of forming an IC, concurrently forming the information unit by using certain steps of the IC process so that the information unit remains electrically separate from the IC, and concurrently the antenna by using certain steps of the IC process so that the antenna becomes electrically connected to the information unit.

In another aspect of the invention, laser pulses are applied in wafer form after multiprobe and/or after singulated chip assembly to open selected fuses and thus permanently encode electronic data.

In another aspect of the invention, a method of operating the information unit includes wireless and continuous powering by transmitting continuous interrogation signals from a cooperating interrogation device to the antenna. The interrogation signals are modulated by encoding wave forms from the electronic data stored in the data bank. Using again the antenna, the modulated signals are sent back to and received by the interrogation device.

The technical advances represented by the invention, as well as the objects thereof will become apparent from the following description of the preferred embodiments of the invention, when considered in conjunction with the accompanying drawings and the novel features set forth in the appended claims.

BRIEF DESCRIPTION OF THE DRAWINGS

FIG. 5 is a schematic block diagram of the encoder/modulator circuit as part of the information unit.

FIG. 6 is a representation of the coded output wave form from the encoder.

FIG. 7 is a representation of the modulated output wave form from the modulator.

FIG. 8 is a schematic and simplified representation of the basic concept of an interrogation device powering the information unit and retrieving data from the information unit.

FIG. 9 is a schematic block diagram of the interrogation device.

DETAILED DESCRIPTION OF THE PREFERRED EMBODIMENTS

Figure 1:
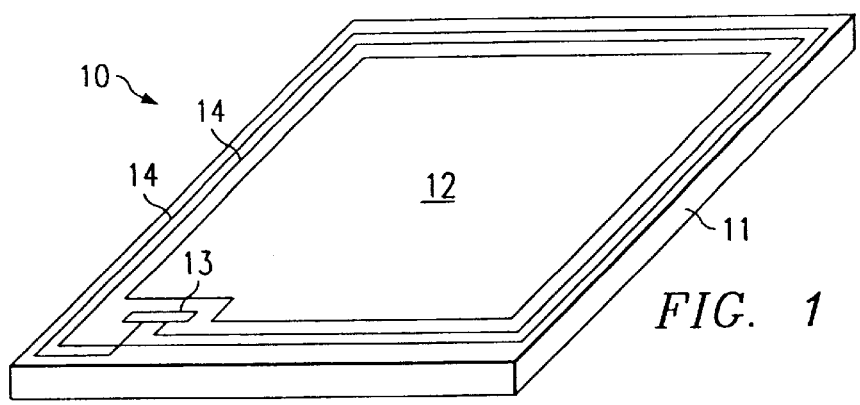
FIG. 1 is schematic and simplified perspective view of a semiconductor chip comprising an integrated circuit, an integrated information unit, and an integrated antenna according to one embodiment of the invention.

The main concept of one embodiment of the invention is shown in FIG. 1. A semiconductor chip, generally designated 10, consists of a semiconductor substrate 11 and an integrated circuit (IC) 12, fabricated by a sequence of process steps into and onto one surface of substrate 11. As defined herein, the term "substrate" refers to a rectangular piece of single-crystalline semiconductor material, carefully sawed from an originally much larger "wafer" which in turn has been sawed from a grown single-crystalline monolith. On one chip surface, the so-called "circuit surface", has been fabricated an IC by numerous photolithograghic, doping and oxidation steps into the semiconductor material, topped by numerous deposition, photolithographic and etching steps onto the semiconductor material.

The term "semiconductor material" includes silicon, gallium arsenide, other III–V and II–VI compounds, and any other semiconductor material customarily used in electronic device production.

In the same circuit surface as defined by the integrated circuit 12, a much smaller circuit is manufactured according to the present invention which is called herein the "information unit" 13. This information unit is completely integrated into the circuit surface but electrically separate from the integrated circuit 12. In the embodiment of the invention depicted in FIG. 1, the information unit 13 is located in a corner of chip 10. With 250 to 350 logic gates, the information unit requires about $0.1 \times 10E6$ $\mu m^2$ when fabricated with the 0.28 $\mu m$ CMOS technology node. Its total area, however, is miniscule compared to the area of a typical IC (about $100 \times 10$ E6 $\mu m^2$ for a 64 Mbit DRAM chip produced with the same technology node). The small area to be reserved for the information unit can possibly be reduced even further by positioning active portions of the circuit under the area of several IC bond pads where they can help to reinforce IC bond pads. The information unit can also be positioned at any other convenient location of the circuit surface, since there is no preference or restriction where the information unit has to be positioned for its functional effectiveness. Design and functioning of the information unit is described in more detail in conjunction with FIG. 2.

FIG. 1 also shows the antenna 14, electrically separate from the IC but in electrical contact with the information unit. It is essential for the present invention that the antenna is integrated into the circuit surface, and not a discrete external hardware part. Antenna 14 has sufficient length to receive constant radio frequency signals generated by a cooperating interrogation device (and re-transmit them to the device). Antenna 14 is, for instance, laid out in a number of loops in one plane or in different levels around the periphery of the IC, each loop connected to the following one by a metal-filled via in order to resemble a spiral. Antenna 14 is made of electrically conductive material such as a metal or doped polysilicon. By way of example, antenna 14 may comprise aluminum (sometimes doped with up to 2% copper and 1% silicon) or copper, about 200 to 1000 nm thick, often with a thin (about 10 to 500 nm) barrier underlayer (made of titanium, titanium nitride, or titanium-tungsten, tantalum, tantalum nitride, tantalum silicon nitride, tungsten nitride, or tungsten silicon nitride).

In another embodiment, the function of the antenna is fulfilled by a sacrificial metal structure sometimes positioned as a seal around ICs in proximity to the dicing street in order to arrest nascent insulator cracks and to protect the IC against moisture inlet (see patent application Ser. No. 60/073,939, filed Feb. 6, 1998, titled "Sacrificial Structures for Arresting Insulator Cracks in Semiconductor Devices", assigned to Texas Instruments Incorporated). In this double-purpose arrangement, the sacrificial structure has to be electrically separate from the IC but in electrical contact with the information unit. A typical sacrificial structure comprises a plurality of individual seal structures, each one consisting of a multitude of patterned metal layers, positioned on top of each other and mutually connected by metal-filled via grooves. The seal structures are manufactured as a group step by step as sequential depositions of insulators and metal together with the fabrication of the IC elements. The insulators typically are plasma-deposited oxides, or spun-on glass, or combinations thereof, sometimes including dielectrics exhibiting low dielectric constants yet also mechanical weakness. The via grooves are plasma-etched into the interlayer insulation films and filled with metal (for instance, tungsten, copper, aluminum, or others). The metal layer deposited next is etched into a pattern so that it extends over a region of interlayer insulation film adjacent to each via groove (usually 4 to 20 $\mu m$ wide). The sequence of these process steps is repeated several times, as often as there are metal layer fabrication steps of the IC.

Figure 2:
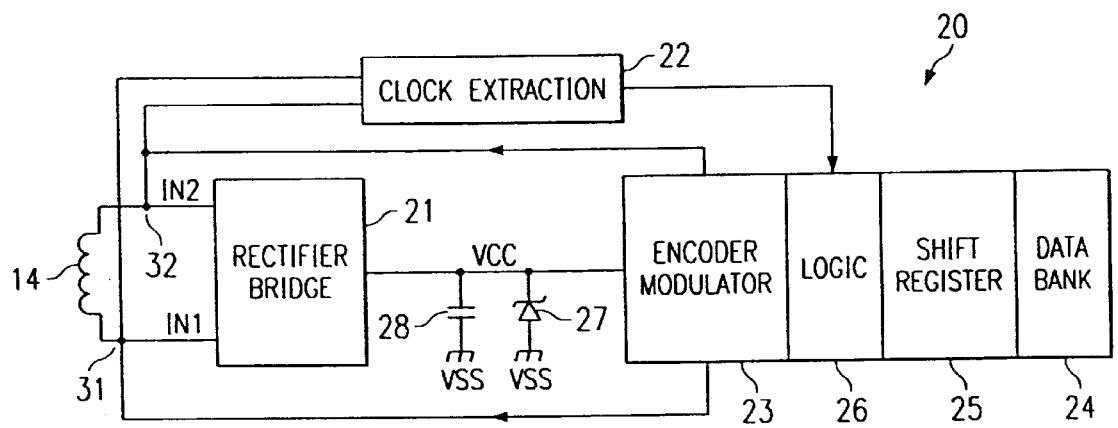
FIG. 2 is a schematic block diagram of the information unit.

A schematic block diagram of the information unit 20 is shown in FIG. 2. Besides the antenna 14, the information unit 20 consists of the rectifier bridge circuit 21, an electronic clock extraction circuit 22, and an electronic encoder/modulator circuit 23. Furthermore, the information unit 20 comprises the important data bank 24 with the permanently encoded data, a shift register 25, and logic circuit 26. All these contributing blocks or subcircuits of information unit 20 are manufactured concurrent with the fabrication of the IC; they are adaptable to any technology node employed for fabricating the IC, and therefore need no additional fabrication steps. In the end, all subcircuits of the information unit are fully integrated into the semiconductor chip.

The method of operating of the information unit 20 comprises:

Storing data in a code which identifies, for instance, the chip manufacturer, the customer/user, and any detailed information related to the fabrication and characterization of the chip deemed important.

Activating the series of subcircuits sequentially (without interfering in any way with the operation of the main IC), when the information unit is triggered by external signals, so that first the stored data is retrieved, then utilized to modulate the interrogating signals, and finally readied for re-broadcasting back to the interrogator.

Transmitting the stored data to the receiver of the interrogator in a format so that the data can be electronically processed. Such processing may include anaysis in electrical testers relative to the encoded information and parametric and functional performance.

Figure 3:
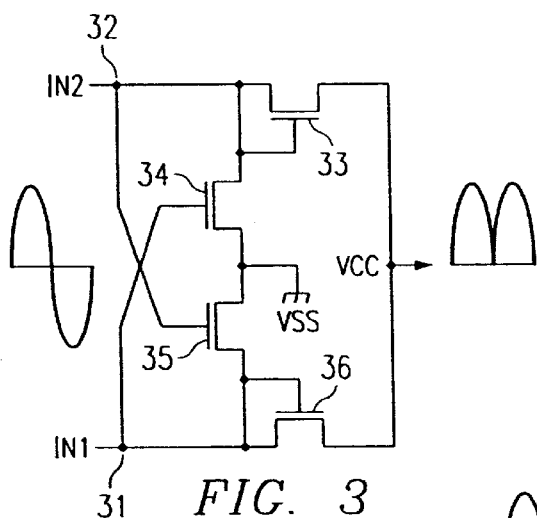
FIG. 3 is a schematic block diagram of the rectifier bridge as part of the information unit.

The radio frequency signals from the interrogation device (usually in the 100 kHz to 1 MHz range) are received by the antenna 14, in which they induce an ac current. This ac current is rectified by the rectifier bridge 21; it is then able to power the information unit 20. The rectifier bridge 21 in FIG. 2 is depicted in more electrical detail in the embodiment of FIG. 3. The rectifier bridge shown uses only n-channel transistors and can therefore be fabricated in CMOS technology. Inputs 31 (IN1) and 32 (IN2) are connected to antenna 14 (see FIG. 2). The incoming ac voltage is indicated by the input sinus-wave. When the voltage of input 32 (IN2) is positive with respect to input 31 (IN1), then diode 33 is forward biased, transistor 34 is "off", transistor 35 is "on", and diode 36 is reverse biased. Consequently, there is a path open from input 32 to VCC (through 33) and from VSS to input 31 (through 35). Similarly, when input 31 is positive with respect to input 32, then diode 36 is forward biased, transistor 35 is "off", diode 33 is reverse biased and transistor 34 is "on". The subcircuit of FIG. 3 behaves thus as a full-wave rectifier circuit. The outgoing rectified voltage is indicated by the output rectified wave.

Referring now to the information unit of FIG. 2, the Zener diode 27 clamps the voltage, induced by the antenna 14 and rectified by the rectifier bridge circuit (described in FIG. 3), not to exceed the maximum VCC rating of the information unit. However, implementing a true Zener diode would be expensive since this component is not supported in standard IC process flows (such as the CMOS process flow). It turns out that it is sufficient for all practical purposes to substitute for the Zener diode a structure which consists of a stack of n-channel MOS transistors in series. Each transistor has its gate connected to its drain, while its source is connected to the following transistor gate/drain of the stack, forming a stack of diode-like components. Each diode-like component has a breakdown characteristic equivalent to the threshold voltage of the transistor. Consequently, the whole stack ensures that the rectified voltage VCC does not increase above the sum of the threshold voltages of the component transistors.

The output voltage of the full-wave rectifier needs to be filtered and smoothed. The integrated capacitor 28 of FIG. 2 serves this purpose. The capacitor 28 is in the 50 to 100 pF range; it can be as simple as a gated capacitor, i.e., an n-channel MOS transistor with the gate terminal connected at VCC, and the source and drain terminals connected to the substrate (VSS, ground).

Figure 4:
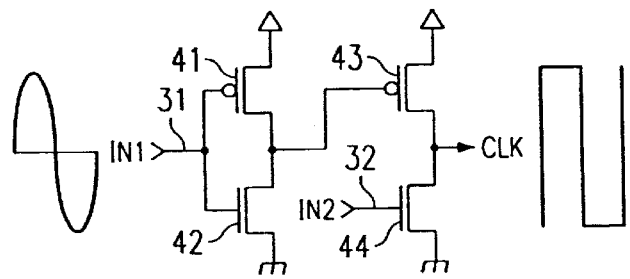
FIG. 4 is a schematic block diagram of the clock extraction circuit as part of the information unit.

FIG. 4 depicts the clock extraction circuit of the information unit. A clock signal is necessary for the operation of the information unit. It has to be reconstructed from the wave-form present at the inputs 31 (IN1) and 32 (IN2). Transistors 41 and 43 are p-channel MOS transistors, while transistors 42 and 44 are n-channel MOS transistors. When the voltage at input 31 (IN1), as measured with respect to substrate voltage VSS or ground, is greater than the voltage at input 32 (IN2), the clock signal CLK is high. When input voltage 32 (IN2) is greater than input voltage 31 (IN1), clock signal CLK is low. The extracted clock signal is thus a square wave of the same frequency as the ac voltage induced in antenna 14 by the interrogation device. Consequently, it is ensured that the information unit and the interrogation device are in synchronous operation.

Referring to FIG. 2, the data bank 24 stores the information in form of non-volatile memories. The specific embodiment of the memories depends on the process chosen for the IC fabrication. For example, if the IC is a DRAM, the data bank is preferably a multitude of fuses made of doped polysilicon material. If the IC is a microprocessor, the data bank may be preferably a multitude of fuses made of metal (of example, aluminum, copper, or any of the metal sandwiches described above). In these embodiments, the fuses can be irreversibly opened by laser pulses to record the data, for instance by the manufacturer at multiprobe testing of the semiconductor whole wafers, or by the customer at assembly of individual semiconductor chips.

Alternative embodiments of the data bank 24 are non-volatile cells which are available for ICs that have non-volatile memory arrays embedded, such as erasable programmable read-only memories (EPROMs), electrically erasable programmable read-only memories (EEPROMs), or FLASH (specific EEPROMs). In these devices, the data is recorded by electrically writing the cells. For this purpose, additional dedicated metal pads are needed to allow placement of the probes for writing (not to be used for later bonding in assembly); in order to minimize the number of these auxiliary pads, a serial interface would be preferred, and in order to minimize the consumption of precious real estate, placement of portions of the active circuit under the pads for reinforcement my be advantageous.

Since the link between the interrogation device and the information unit is inherently of serial type, the information from the data bank 24 is first loaded in parallel into the shift register 25 of FIG. 2. From here, it is serially sent into the logic circuit 26 for processing. It then is sent to the encoder/modulator circuit 23 for transmission to antenna 14 and the interrogation device. An embodiment of shift register 25 uses conventional CMOS shift register cells.

The logic circuit 26 in FIG. 2 comprises the control logic for the data bank 24, special test modes, shift register control, and data handling encoder/modulator circuit 23. An embodiment of the logic circuit 26 uses conventional CMOS logic gates.

The encoder/modulator circuit 23 of FIG. 2 is shown in more detail in FIG. 5. The encoded sync generator circuit generates a coded string of data which is transmitted before the real transmission of the actual data in order to set the demodulator of the interrogation device in a stand-by mode, waiting for the arrival of the actual data from the data bank of the information unit. The coded output wave form from the encoder is depicted in FIG. 6, and the modulated output wave form from the modulator is depicted in FIG. 7. The wave form called "modout" in FIGS. 5 and 7 is a phase shift key modulation similar to the modulation of a FM radio transmission. The inputs "IN1" and "IN2" in FIG. 5 are the same as in FIGS. 2, 3 and 4 which also have been given the reference numerals 31 and 32, respectively, in those FIGS. The change in time of the wave form by 90 $\mu$s, indicated in FIG. 5, is needed to differentiate this wave form from the incoming one which powers the information unit.

The basic concept of a wireless tagging system comprising an interrogation device and the information unit is depicted in FIG. 8. According to the invention, the method of operating an information unit 20 (described in more detail in FIG. 2) comprises the following the following steps:

Powering the information unit 20 wirelessly and continuously by transmitting continuous interrogation signals from the interrogation device 80. For this purpose, the interrogation device 80 comprises a transmitter for transmitting constant radio frequency interrogation signals, thereby communicating, with the help of antenna 81, continuously with the information unit 20, equipped with antenna 14.

Modulating the interrogation signals by encoding wave forms (as shown in FIGS. 5, 6 and 7) from the electronic data stored in the data bank 24 of the information unit 20.

Retrieving the modulated signals by broadcasting them back (using antenna 14) to the interrogation device 80 (using antenna 81). For this purpose, the interrogation device 80 comprises a receiver for receiving the modulated signal information.

Once activated by the interrogation device, the information unit starts sending back data from the data bank to the interrogation device through the coupled antennas 14 and 81. The data transmission lasts as long as the information unit is powered by the ac radiation generated by the antenna 81 of the interrogation device.

Typically, the frequency of the ac radiation generated by the interrogation device is in the 100 kHz to 1 MHz range, while the frequency of the signals transmitted by the information unit is about 1/10 of that range (starting at about 10 kHz). It is, therefore, possible for the interrogation device to detect the information unit signals through a low pass filter (reference number 91 in FIG. 9).

FIG. 9 depicts the interrogation device 80 in more detail. Antenna 81 is best made of ferrite, because it increases the antenna performance. It enhances the efficiency of transferring energy to the information unit; it also increases the sensitivity in receiving the modulated signals from the information unit (starting at about 10 kHz).

The coil driver 90 of the interrogation device 80 supplies the antenna 81 with an ac current, which is used to transmit energy to the information unit. The frequency is usually in the 100 kHz range. Conventional electronic circuitry is used in the coil driver 90.

The low-pass filter circuit 91 serves to let pass only signals with a frequency below about 12 kHz. In this fashion the electromagnetic waves of about 100 kHz generated by the coil driver 90 cannot pass the filter 91, while the waves of about 10 kHz arriving from the information unit can pass. The low pass filter circuit 91 comprises commercial digital signal processors.

The electromagnetic waves coming from the information unit through the low-pass filter carry the data information modulated within them. The demodulator circuit 92 in FIG. 9 extracts the data from the carrier signals and reconstructs them in their original forms, as they were stored in the data bank 24 (see FIG. 2) of the information unit 20 (see FIGS. 2 and 8). The demodulator works, in principle, as an FM radio receiver.

After the demodulator, the retrieved data can be stored or electronically processed. Such processing may include the analysis by electronic testers especially relative to the encoded information and parametric and functional performance (for example, speed and power). This analysis permits, for instance, a comparison of the performance characteristics of each individual IC at multiprobe, while still in wafer form, with the ones at final test, after assembly—a task essential for better product and process development, process control, and building-in reliability, but only feasible through the present invention.

What is claimed is:

1. A method of fabricating an information unit into an integrated circuit chip comprising:

forming an integrated circuit into a semiconductor substrate, using a plurality of process steps;

concurrently forming an information unit using a selection of said process steps so that said unit becomes integrated into said chip but remains electrically separate from said integrated circuit;

concurrently forming an antenna using a selection of said process steps so that said antenna becomes integrated into said chip and electrically connected to said information unit;

providing a data bank within said information unit; and encoding electronic data permanently into said data bank.

2. The method according to claim 1 wherein said data bank comprises a plurality of electrical fuses.

3. The method according to claim 1 wherein said encoding comprises applying laser pulses to selected fuses whereby said fuses are irreversibly opened.

4. The method according to claim 3 wherein said laser pulses are generated by lasers commonly used for repair functions in circuit production.

5. The method according to claim 3 wherein said laser pulses are applied after the semiconductor wafer has been electrically tested.

6. The method according to claim 3 wherein said laser pulses are applied to said fuses after the individual chip has been assembled.

7. The method according to claim 1 wherein said data bank comprises a plurality of non-volatile cells.

8. The method according to claim 1 wherein said encoding comprises electrically writing the non-volatile cells.

9. The method according to claim 8 wherein said writing is applied after the semiconductor wafer has been electrically tested in wafer form.

10. The method according to claim 8 wherein said writing the non-volatile cells is applied after the individual chip has been assembled.

11. A method of operating an information unit integrated into an integrated circuit chip, said unit having an electronic data bank with permanently encoded data and further an electrically connected integrated antenna, comprising:

powering said information unit wirelessly and continuously by transmitting continuous interrogation signals from an interrogation device to said antenna;

modulating said interrogation signals by encoding wave forms from said electronic data stored in said data bank; and retrieving said modulated signals by sending them back to the interrogation device, using said antenna.

12. The method according to claim 1 whereby said powering is performed by an interrogation device comprising:

a transmitter for transmitting constant radio frequency interrogation signals, thereby communicating continuously with said information unit; and a receiver for receiving modulated signal information.

13. The method according to claim 11 wherein said retrieved modulated signals are formatted such that they can be electronically processed.

14. The method according to claim 13 wherein said electronic processing includes the analysis in electronic testers relative to encoded information and parametric and functional performance.

\* \* \* \* \*